United States Patent
Roy (10) Patent No.: US 9,693,486 B1
(45) Date of Patent: Jun. 27, 2017

(54) AIR HANDLING UNIT WITH A CANOPY THEREOVER FOR USE WITH A DATA CENTER AND METHOD OF USING THE SAME

(71) Applicant: Switch Ltd., Las Vegas, NV (US)

(72) Inventor: Rob Roy, Las Vegas, NV (US)

(73) Assignee: Switch, Ltd., Las Vegas, NV (US)

( * ) Notice: Subject to any disclaimer, the term of this patent is extended or adjusted under 35 U.S.C. 154(b) by 0 days.

(21) Appl. No.: 14/641,226

(22) Filed: Mar. 6, 2015

Related U.S. Application Data (63) Continuation-in-part of application No. 13/651,319, filed on Oct. 12, 2012, which is a continuation of application No. 12/384,109, filed on Mar. 30, 2009, now Pat. No. 8,523,643, application No. 14/641,226, filed on Mar. 6, 2015, which is a continuation of application No. 12/384,109, filed on Mar. 30, 2009, now Pat. No. 8,523,643, which is a continuation-in-part of application No. 12/138,771, filed on Jun. 13, 2008.

(60) Provisional application No. 61/040,636, filed on Mar. 28, 2008, provisional application No. 60/944,082, filed on Jun. 14, 2007.

(51) Int. Cl.
*H05K 7/20* (2006.01)

(52) U.S. Cl.
CPC ..... *H05K 7/20827* (2013.01); *H05K 7/20836* (2013.01)

(58) Field of Classification Search
CPC ........................................ H05K 7/20
USPC ........................................ 454/184
See application file for complete search history.

(56) References Cited

U.S. PATENT DOCUMENTS

| | | | |
|---|---|---|---|
| 4,102,463 A | 7/1978 | Schmidt | |
| 4,548,164 A | 10/1985 | Ylonen et al. | |
| 5,545,086 A * | 8/1996 | Sharp | F24F 11/0001 454/229 |
| 5,769,365 A * | 6/1998 | Onishi et al. | 248/49 |
| 5,969,292 A * | 10/1999 | Snider, Jr. et al. | 174/498 |
| 6,034,873 A * | 3/2000 | Ståhl et al. | 361/701 |
| 6,407,533 B1 | 6/2002 | Bartek et al. | |
| 6,427,454 B1 | 8/2002 | West | |
| 6,822,859 B2 | 11/2004 | Coglitore et al. | |
| 6,833,991 B2 * | 12/2004 | Van Gaal | 361/690 |
| 6,862,179 B2 | 3/2005 | Beitelmal et al. | |
| 7,278,273 B1 * | 10/2007 | Whitted | H05K 7/1497 361/690 |
| 7,511,959 B2 * | 3/2009 | Belady | G06F 1/18 165/104.33 |
| 7,542,287 B2 | 6/2009 | Lewis et al. | |
| 7,604,535 B2 | 10/2009 | Germagian et al. | |
| 7,787,260 B2 | 8/2010 | Hruby et al. | |

(Continued)

OTHER PUBLICATIONS

Intel, publication date, if any, unknown, "Air-Cooled High-Performance Data Centers: Case Studies and Best Methods", white paper, dated Nov. 2006, pp. 1-20.

*Primary Examiner* — Steven B McAllister
*Assistant Examiner* — Samantha Miller
(74) *Attorney, Agent, or Firm* — Weide & Miller, Ltd.

(57) ABSTRACT

Described herein is an air handling unit that includes canopies for compressor fans and exhaust fans located on a top thereof, which canopies provide for noise abatement and a canopy to assist in keeping precipitation out. The canopies further include louvers that can be controlled to provide for even further noise abatement and precipitation control.

20 Claims, 9 Drawing Sheets

(56) References Cited

U.S. PATENT DOCUMENTS

| | | |
|---|---|---|
| 7,804,685 B2 | 9/2010 | Krietzman |
| 8,037,644 B2 | 10/2011 | Hall |
| 8,040,673 B2 | 10/2011 | Krietzman |
| 8,072,780 B1 | 12/2011 | Roy |
| 8,113,010 B2 | 2/2012 | Carlson |
| 8,144,467 B2 | 3/2012 | Campbell et al. |
| 8,159,820 B2* | 4/2012 | Ibori et al. .................. 361/695 |
| 8,180,495 B1* | 5/2012 | Roy ............................... 700/278 |
| 8,209,993 B2 | 7/2012 | Carlson et al. |
| 8,223,495 B1 | 7/2012 | Carlson et al. |
| 8,257,155 B2 | 9/2012 | Lewis |
| 8,282,451 B2 | 10/2012 | Taylor |
| 8,469,782 B1* | 6/2013 | Roy ............................... 454/187 |
| 8,493,732 B2* | 7/2013 | Lineal et al. ................. 361/695 |
| 8,514,572 B2* | 8/2013 | Rogers ............... H05K 7/20745 165/287 |
| 8,523,643 B1* | 9/2013 | Roy ............................... 454/184 |
| 8,553,409 B2* | 10/2013 | Rehmann et al. ........ 361/679.47 |
| 8,705,233 B2* | 4/2014 | Rehmann et al. ........ 361/679.49 |
| 8,824,142 B2* | 9/2014 | Jewell-Larsen et al. ..... 361/694 |
| 9,363,925 B2* | 6/2016 | Czamara ............... H05K 7/1497 |
| 2003/0066638 A1* | 4/2003 | Qu ........................... C09K 5/14 165/186 |
| 2003/0181158 A1 | 9/2003 | Schell et al. |
| 2004/0004813 A1 | 1/2004 | Coglitore |
| 2004/0118137 A1 | 6/2004 | Patel et al. |
| 2005/0170770 A1 | 8/2005 | Johnson et al. |
| 2005/0225936 A1* | 10/2005 | Day ................... H05K 7/20745 361/679.47 |
| 2005/0278070 A1 | 12/2005 | Bash et al. |
| 2006/0146520 A1 | 7/2006 | Vitense et al. |
| 2006/0187636 A1 | 8/2006 | Fink et al. |
| 2006/0260338 A1* | 11/2006 | VanGilder .......... H05K 7/20745 62/259.2 |
| 2007/0032979 A1 | 2/2007 | Hamann et al. |
| 2007/0040263 A1 | 2/2007 | Towada |
| 2007/0064389 A1 | 3/2007 | Lewis, II et al. |
| 2007/0078635 A1 | 4/2007 | Rasmussen et al. |
| 2007/0094946 A1* | 5/2007 | Schoeny .................... E04H 5/02 52/79.1 |
| 2007/0274043 A1* | 11/2007 | Shabany ............. H05K 7/20645 361/696 |
| 2008/0029250 A1 | 2/2008 | Carlson |
| 2008/0055848 A1 | 3/2008 | Hamburgen et al. |
| 2008/0055850 A1 | 3/2008 | Carlson et al. |
| 2008/0094797 A1* | 4/2008 | Coglitore ........... H05K 7/20745 361/679.5 |
| 2008/0305733 A1 | 12/2008 | Noteboom |
| 2009/0239461 A1 | 9/2009 | Lewis et al. |
| 2010/0061059 A1 | 3/2010 | Krietzman et al. |
| 2010/0110626 A1* | 5/2010 | Schmitt .............. H05K 7/20745 361/679.47 |
| 2010/0144265 A1 | 6/2010 | Bednarcik et al. |
| 2010/0154448 A1* | 6/2010 | Hay .......................... G06F 1/20 62/175 |
| 2010/0304657 A1 | 12/2010 | Gallmann et al. |
| 2010/0328889 A1 | 12/2010 | Campbell et al. |
| 2011/0014862 A1 | 1/2011 | Honold et al. |
| 2011/0078480 A1 | 3/2011 | Calo et al. |
| 2011/0143644 A1 | 6/2011 | McMahan et al. |
| 2011/0239683 A1* | 10/2011 | Czamara ............. H05K 7/20745 62/259.4 |
| 2011/0306288 A1* | 12/2011 | Murayama .......... F24F 11/0001 454/184 |

* cited by examiner

AIR HANDLING UNIT WITH A CANOPY THEREOVER FOR USE WITH A DATA CENTER AND METHOD OF USING THE SAME

BACKGROUND

Field of the Art

The present disclosure relates to air handling units disposed external to a facility.

Background

Data centers/server co-location facilities are well-known. In such facilities, rows of electronics equipment, such as servers, typically owned by different entities, are stored. In many facilities, cabinets are used in which different electronics equipment is stored, so that only the owners of that equipment, and potentially the facility operator, have access therein. In many instances, the owner of the facilities manages the installation and removal of servers within the facility, and is responsible for maintaining utility services that are needed for the servers to operate properly. These utility services typically include providing electrical power for operation of the servers, providing telecommunications ports that allow the servers to connect to transmission grids that are typically owned by telecommunication carriers, and providing air-conditioning services that maintain temperatures in the facility at sufficiently low levels for reliable operation.

U.S. Pat. No. 8,523,643, assigned to the same assignee and for which this application is a continuation-in-part, describes a data center that includes a plurality of external air handling units in which each external air handling unit includes both an evaporator unit and a condenser unit, which units are located in a standardized, accessible and relatively convenient positions relative to the facility should any of the units need to be accessed and/or removed for repair or replacement.

This present application uses the teachings provided in the above-noted related utility applications and provisional applications, and adds certain improvements as further described herein.

SUMMARY

Described herein is a system with improved air handling units, in which each of the air handling units contains a canopy thereover.

In one aspect is provided a facility with a plurality of air handling units that are each disposed on only one side external wall of a facility, with the canopy including a canopy that diverts noise back toward the facility.

In another aspect, the air handling units further include a configurable louver system within the canopy that is controllable to further provide for (1) further reducing noise emissions from the air handling unit, and particularly exhaust fans that expel heated air into the external environment as well as compressor fans that assist in expelling heat from a compressor coolant; and (2) further reducing precipitation from entering into the air handling unit through the canopy.

BRIEF DESCRIPTION OF THE DRAWINGS

These and other aspects and features of the present invention will become apparent to those of ordinary skill in the art upon review of the following description of specific embodiments of the invention in conjunction with the accompanying figures, wherein:

FIGS. 1B1 and 1B2 illustrate cut-away perspective views of an exterior and interior portion of the data center or co-location facility according to U.S. Pat. No. 8,523,643.

DETAILED DESCRIPTION OF THE PREFERRED EMBODIMENTS

In one aspect, the embodiments herein are directed to an overall data management center, including the building itself, interior aspects of the building, as well as air handling equipment purposefully located outside yet in close proximity to the building, which air handling equipment is used for purposes of providing both efficient building cooling, as described further herein.

Figure 1A:
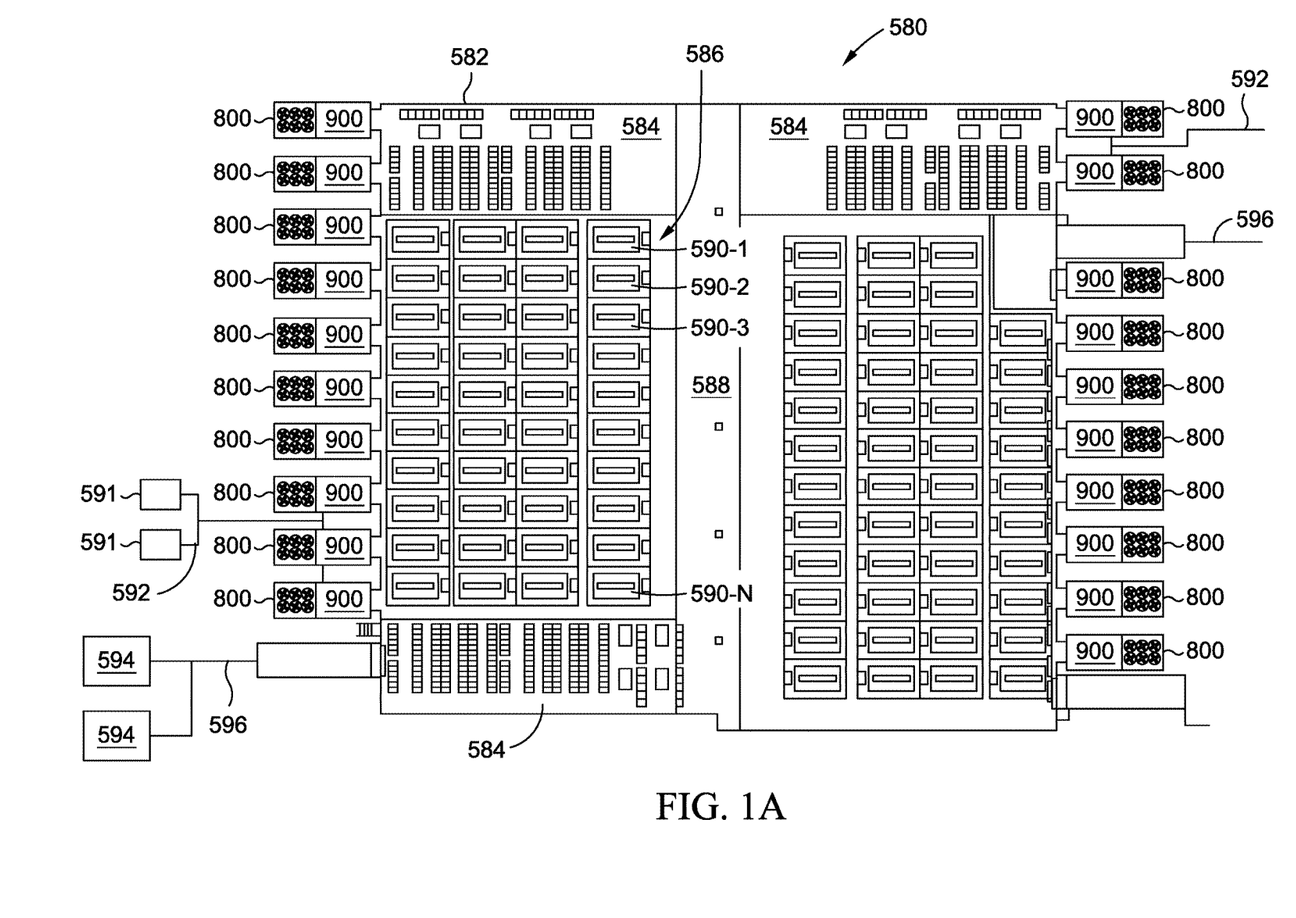
FIG. 1A illustrates a top view of a data center or co-location facility according to U.S. Pat. No. 8,523,643.

FIG. 1A illustrates a top view of a portion of a data center or co-location facility 580 according to according to U.S. Pat. No. 8,523,643. In this embodiment, unlike the embodiment shown in FIG. 1(a)-(c) of the '643 patent, the condenser air conditioning units 800 and heat expulsion chamber 900 are all disposed outside of the exterior walls 582 of the facility, as will be described further herein. There is also additional equipment disposed outside of the exterior walls 582, including evaporation units 591 that feed cooled water along lines 592 to the air conditioning units 800 as described further herein, as well as backup diesel generators 594 for supplying backup power along a transmission line 596 in the case of power outage from remotely supplied power on the national power grid.

Figure 1B:
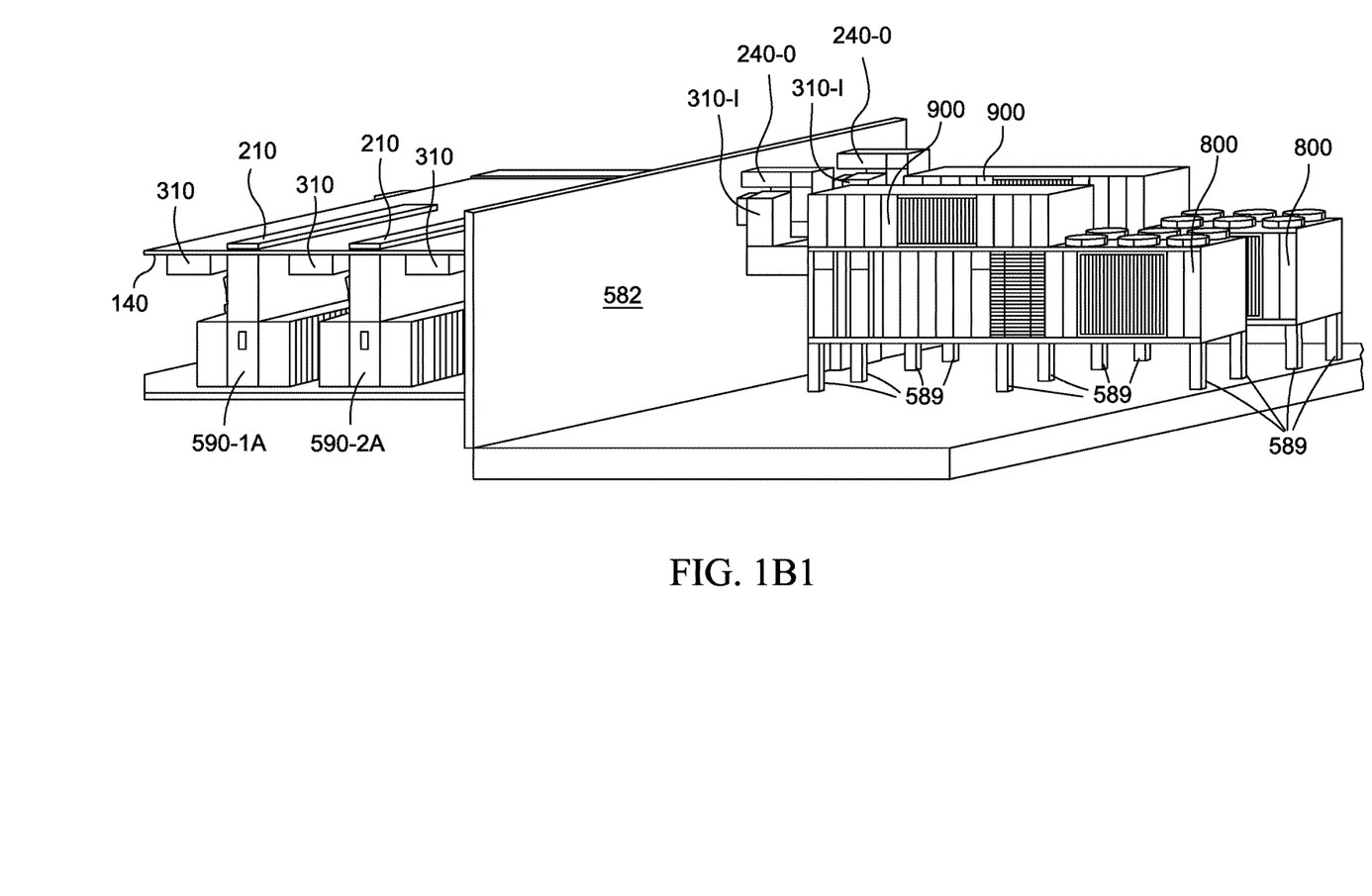

FIG. 1B1 illustrates a cut-away perspective view of an exterior and interior portion (with a 90° rotation for illustrative purposes of the interior portion) of the data center or co-location facility 580, with the exterior wall 582 being explicitly illustrated. Shown are two of the cabinet clusters 590-1A and 590-2A, and the corresponding hot air area containment chambers 210 and cold air ducts 310, which are respectively connected to the warm exhaust outlets 240-0 and cold duct inlets 310-I. The warm exhaust outlets 240-0 and cold duct inlets 310-I connect to heat expulsion chamber 900 and condenser units 800, respectively.

Figure 1B:
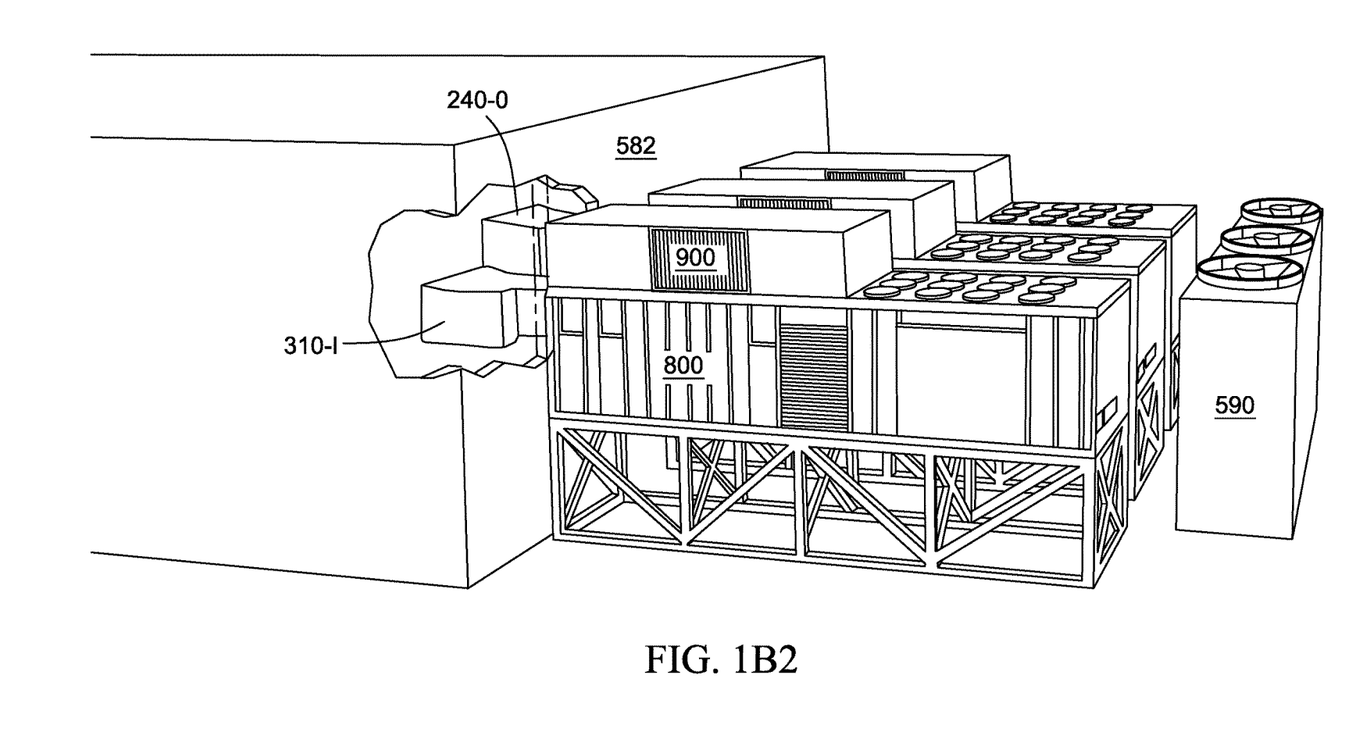

FIG. 1B2 provides a slightly varied embodiment, in which the cold duct inlets 310-I and warm exhaust outlets 240-0 are each at the same level as the condenser units 800 and heat expulsion chamber 900, respectively, and the warm exhaust outlets 240-0 contain a 90° angled area, which allows for better hot air flow into the heat expulsion chambers 900.

Within the facility there are provided distribution areas 584 and 588, as shown in FIG. 1A, as well as data center equipment areas 586, which equipment areas 586 each contain an array of cabinet clusters 590 (shown in one of the rows as cabinet clusters 590-1, 590-2, 590-3 . . . 590-N), since within each cabinet cluster 590, various cabinets containing different electronic equipment are disposed in rows, thereby allowing each cabinet cluster 590 to be locked, as well as the cabinets within the cabinet cluster 590.

As is illustrated in FIGS. 1A and 1B1, one condenser unit 800 is paired with one heat expulsion chamber 900, and each are preferably independently movable. As is further illustrated, the condenser units 800 are built to a size standard that allows for transport along US state and interstate highways. Further, the heat expulsion chamber 900 is preferably sized smaller than the condenser unit 800, but still having dimensions that allow for transport using a semitrailer. When transported to the facility 580, the condenser unit 800 is first placed into position, as shown here on posts 589, but other platforms can also be used. As shown in this embodiment, the heat expulsion chamber unit 900 is placed over the condenser unit 800, though other placements, such as adjacent or below, are also possible. Connections of power conduit, miscellaneous cabling, and water needed for proper operation of the condenser units 800 and expulsion chamber 900 is preferably made using easily attachable and detachable components.

With this configuration, the units 800 and 900 are located in standardized, accessible and relatively convenient positions relative to the facility 580 should any of the units 800/900 need to be accessed and/or removed for repair or replacement. Further, these units 800/900 are themselves created using an intentionally transportable design.

FIGS. 2A-2E provide further details regarding the condenser unit 800 and its paired heat expulsion chamber 900. In particular, as shown, the air conditioning apparatus includes the condenser unit 800 and its paired heat expulsion chamber 900. The heat expulsion chamber 900 receives heated air, and emits vented air, and the vented air is released into the external environment, while the condenser unit 800 emits cooled air.

The heat exchange unit 900 contains an exhaust fan 910, controlled by a VFD fan control and I/O signals block 1330 shown in FIG. 3 (discussed below), that emits heat from the heated air as the vented air, thereby allowing return air to pass through a return damper 920, which return damper 920 has a return damper actuator associated therewith.

The condenser unit 800 includes an outside air inlet 810, and has associated an outside air damper 812, thereby allowing outside air to pass therein. This outside air damper 812 is preferably coated with a neoprene seal to prevent pollution particles from passing through the damper 812 when in a closed position, as well as contains a spring-loaded mechanism closing lever that will automatically close the outside air damper 812 upon a removal of power, so that outside air is prevented from intake before backup generators 594 have to start, since after a power-grid power failure condition, before the back-up generators start, uninterruptable power supplies will supply building power, giving a period for the outside air damper 812 to close.

A filter chamber 820, which includes an air intake area 822 coupled to the heat expulsion unit 900 and the outside air inlet 810, is configurable, via the AHU control system 1000, described hereinafter, to receive the return air, the outside air, as well as a mixture of the return air and the outside air, the filter chamber resulting in filtered air. In a preferred implementation of the filters 824 within the filter chamber 820 are included a MERV 7 screen filter with a MERV 16 bag filter therebehind, which allows replacement of the screen filter 824A without replacement of the bag filter, and vice-versa.

The condenser unit 800 includes an air cooling area 830 over which the filtered air passes to create the cooled air. For ease of nomenclature, all of the air within the air cooling area 830 is referred to as filtered air, and only upon emission from the condenser unit is it referred to as cooled air. That notwithstanding, it is understood that along various stages of the air cooling area 830, the filtered air will get progressively cooler in temperature.

The air cooling area 830 of the condenser unit 800 includes a direct cooling coil 840 filled with a gas for direct expansion, such as R134 gas, over which the filtered air passes, the gas being circulated through a condenser 842 disposed in another area of the condenser unit housing, but still in the external area, outside of the building.

Figure 5:
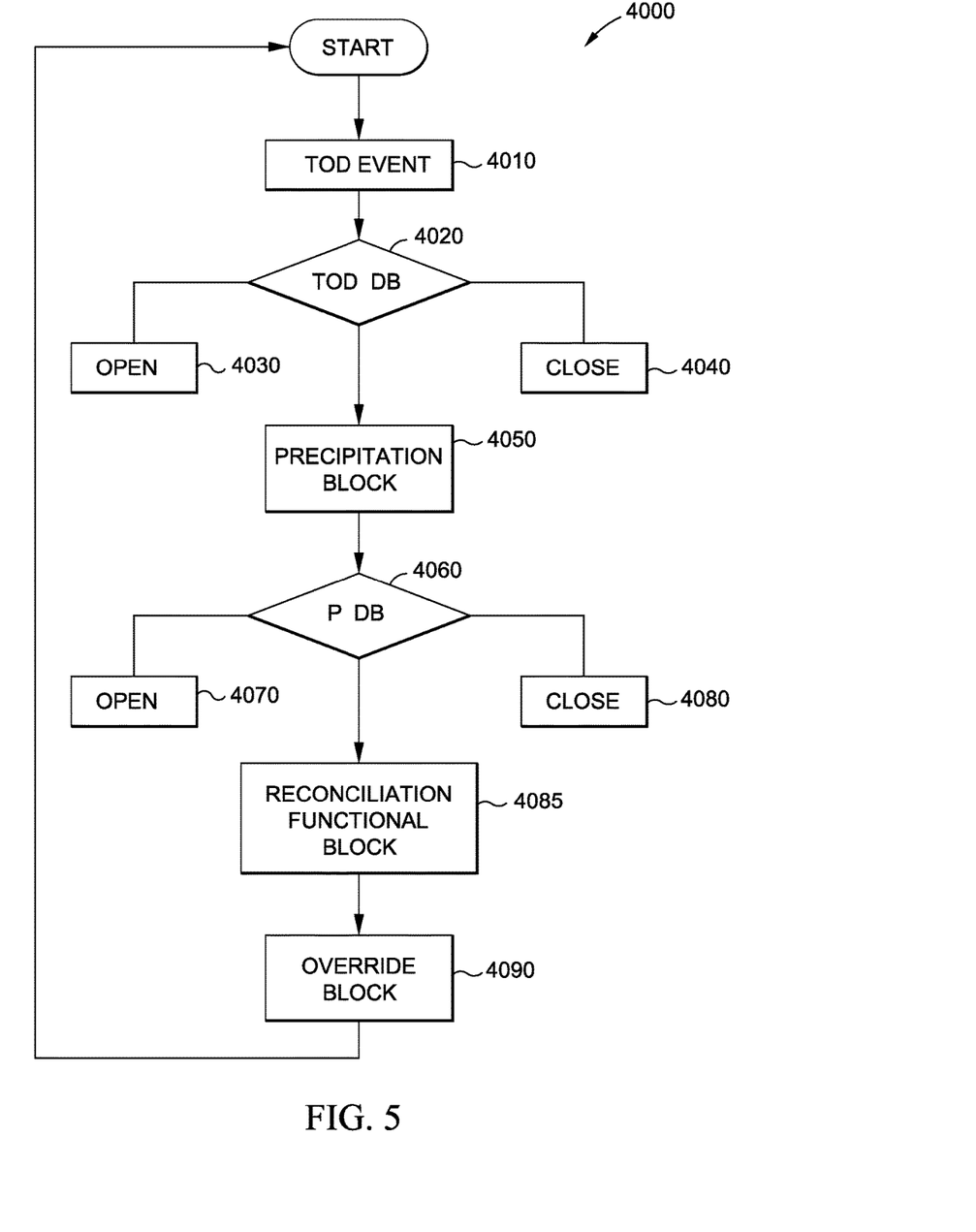
FIG. 5 includes a block diagram of a control system used with an air handling unit according to an embodiment described herein.

The air cooling area 830 also includes an indirect cooling coil 850 filled with cooled water over which the filtered air passes, the cooled water being circulated through an evaporation unit 590 also disposed in the external area, via a water line 592 as shown in FIG. 5. Optionally, though not shown, another coil that is cooled by a chiller could be included.

Also shown in FIGS. 2A-2E is that the air cooling area also has an evaporator 860 that provides a water wall through which the filtered air can pass. An evaporator bypass 862 allows all or some of the filtered air to bypass the evaporator 860, and a bypass damper 880 is opened to allow 100% bypass of the evaporator 860, in which case the evaporator damper 890 is then fully closed. Filtered air can also be partially bypassed, or all go through the evaporator 860, depending on the percentage opening of each of the dampers 880 and 890.

Also within the air cooling area 830 is a fan 870, shown as a fan array of multiple fans, operable to push the filtered air through the air cooling area 830, as well as an outlet damper 880 controllable by an actuator and operable to control an amount of the cooled air delivered from the air cooling area 830.

As shown and mentioned previously the heat exchange unit 900 is contained within a first housing, and the condenser unit 800 is contained within a second housing.

Figure 3:
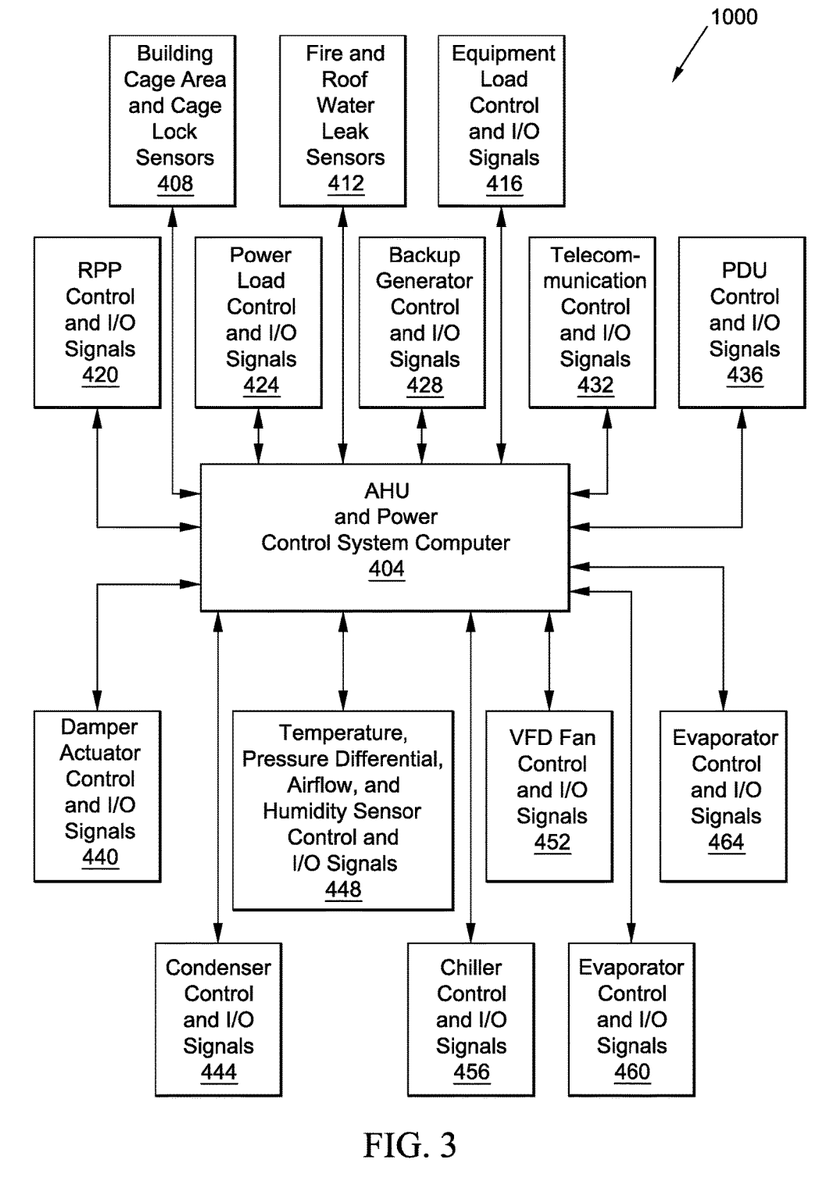
FIG. 3 illustrates a control system according to U.S. Pat. No. 8,523,643.

Furthermore, and with reference to FIG. 3, overall air conditioning system for the data center 500 includes a control system 1000. The control system 1000 contains an air handling unit (AHU) and power control system computer 404, which is operable to automatically control each of the exhaust fan 910, the return damper actuator, the outside air damper actuator, the condenser 842, the bypass damper actuator, the fan 870, and the outlet damper actuator.

The control system 1000 includes building cage area and cage lock sensors 408, fire and roof water leak sensors 412, equipment load control and I/O signals 416, RPP control and I/O signals 420, power load control and I/O signals, backup generator control and I/O signals 428, telecommunication control and I/O signals 432, PDU control and I/O signals 436, damper actuatr control and I/O signals 440, temperature pressure differential airflow and humidity sensor control and I/O signals 448, VFD fan control and I/O signals 452, evaporator control and I/O signals 464, condenser control and I/O signals 444, chiller 10 control and I/O signals 456, evaporator control and I/O signals 460. The systems and signals connect to a AHU and power control system computer 404 as shown.

Air Handling Unit Noise and Precipitation Features

Figure 4:
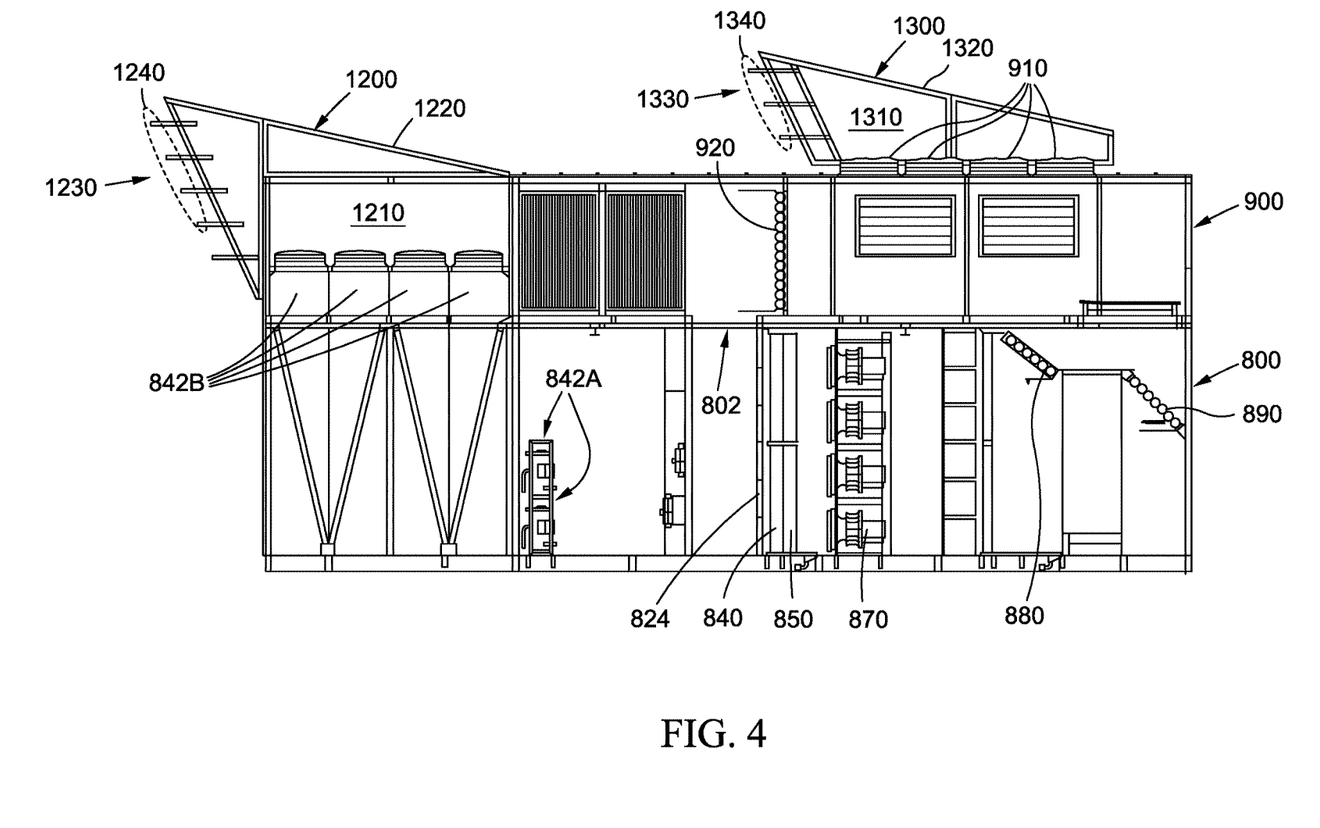
FIG. 4 illustrates a side view of a canopy used with an air handling unit according to an embodiment described herein.

With the aforementioned discussion of the air handler units, which include the heat exchange unit 900 and the condenser unit 800, FIG. 4 that sets forth improvements thereon is described, and is drawn to scale, as noted. The same numerals are used to refer to those components that are the same in the above-described figures, and it is understood that their construction and functionality is the same unless noted otherwise herein. Thus, such features and advantages that are the same are not described again, though their combination with new features and advantages described herein also provide additional benefits.

As shown, the condenser air conditioning units 800 is disposed under the heat expulsion chamber 900, just as previously described above. Further, the airflow pattern from the warm exhaust outlets 240-O (FIG. 1B1) into and through the heat expulsion chamber 900, then into and through the condenser air conditioning units 800, for outputting back to the cold duct inlets 310-I (FIG. 1B1) is the same as previously described.

Altered, however, is the condenser unit 842, as well as the location of the exhaust fans 910, in the manner described herein, as these are two of the components that make the most noise within the air conditioning system 800/900, and which also can allow for external precipitation such as rain or snow to enter into the air conditioning system 800/900.

In particular, with respect to the condenser unit 842, there are the condenser compressors 842A, which are placed inside the out skin 800A of the condenser air conditioning unit 800, thereby maintaining noise from the condenser unit compressors 842A substantially within that substantially enclosed area of the air conditioning unit 800. Further, the condenser unit fans 842B are covered by a condenser canopy 1200, which will be further described.

Figure 6:
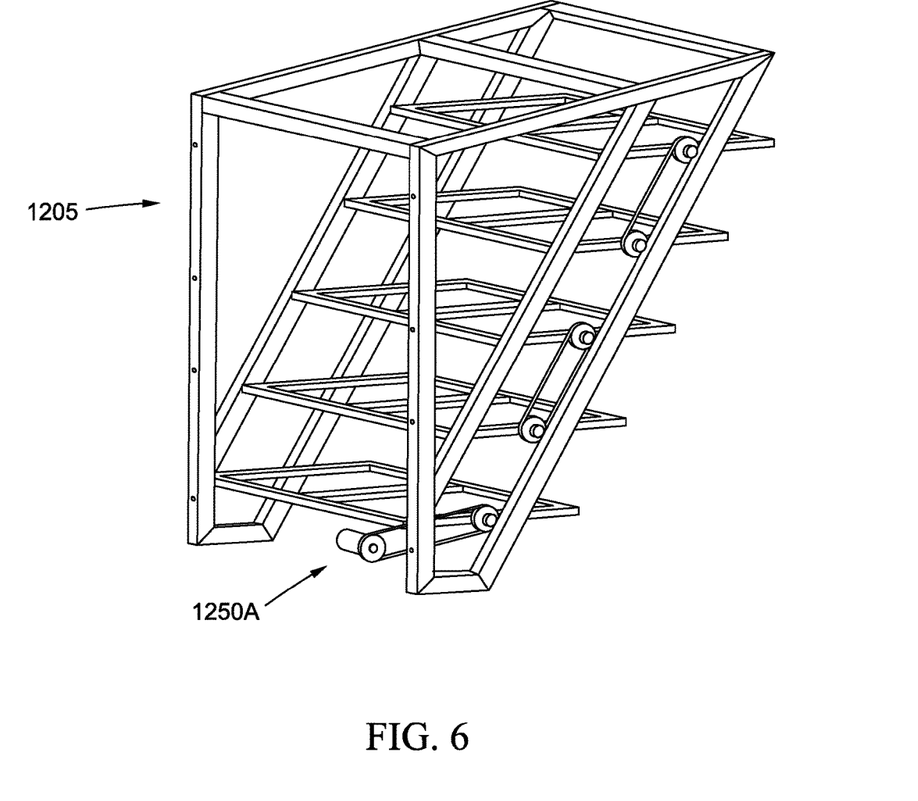
FIG. 6 illustrates a perspective view of the frame of the canopy, and the louvers associated therewith, according to embodiments described herein.

As shown in FIG. 4, the condenser canopy 1200 includes a frame 1205 (as shown in FIG. 6) sidewalls 1210, a top plate 1220, and an air opening 1230, with a plurality of moveable louvers 1240 positioned in a parallel arrangement in order to open and close, preferably in unison, using either a motorized unit 1250A (as shown in FIG. 6) or a manual lever, described hereinafter, in order to both (1) further reduce noise emissions into the external environment, and; (2) further reduce precipitation from entering into the air handling unit through the condenser fans 842B.

Still further, the sidewalls 1210 and top plate 1220, with preferably a welded steel frame and metal shrouding components bolted thereto that together provide a canopy that maintains noise therein, which after internal reflections, a muffled version thereof is primarily emitted through the air opening 1230, as well as provide for keeping precipitation out. The presence of the moveable louvers 1240 positioned in a parallel arrangement allow for their closure either based upon the need for reduced noise or a precipitation event, as will be described further herein.

Figure 2A:
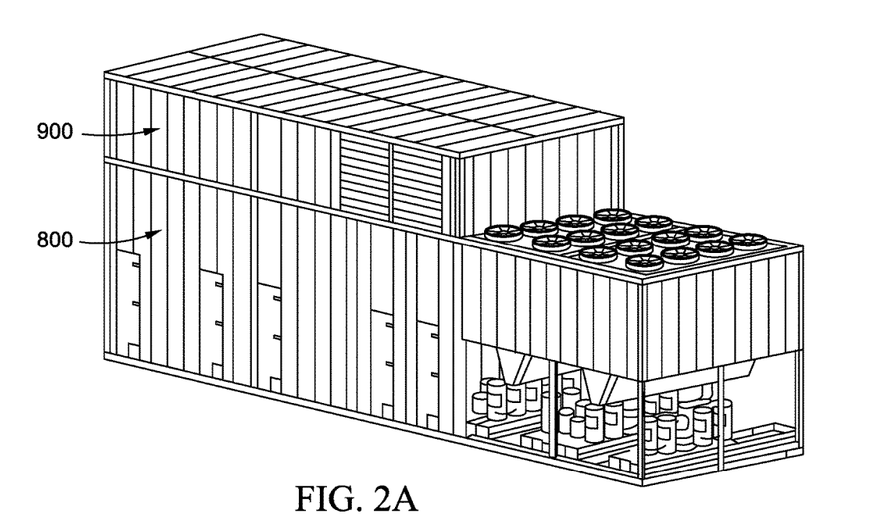
FIGS. 2A, 2B, 2C, 2D, and 2E illustrate an air handling unit according to U.S. Pat. No. 8,523,643.
Figure 2B:
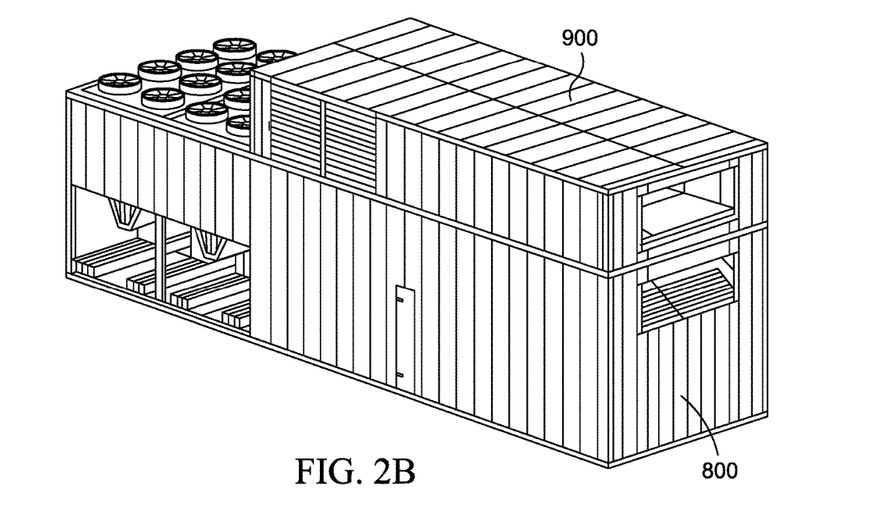
Figure 2C:
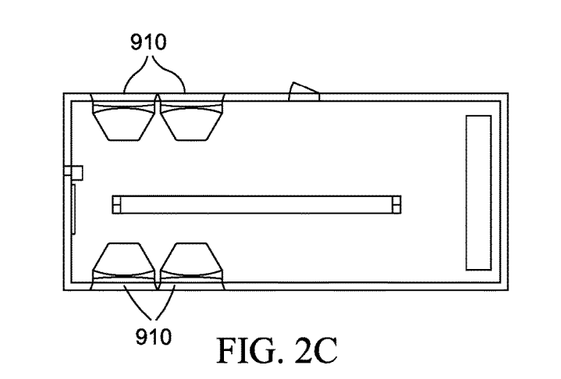
Figure 2D:
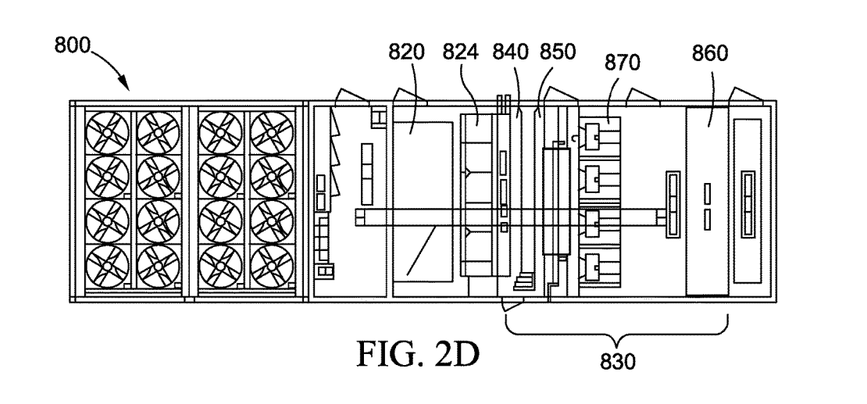
Figure 2E:
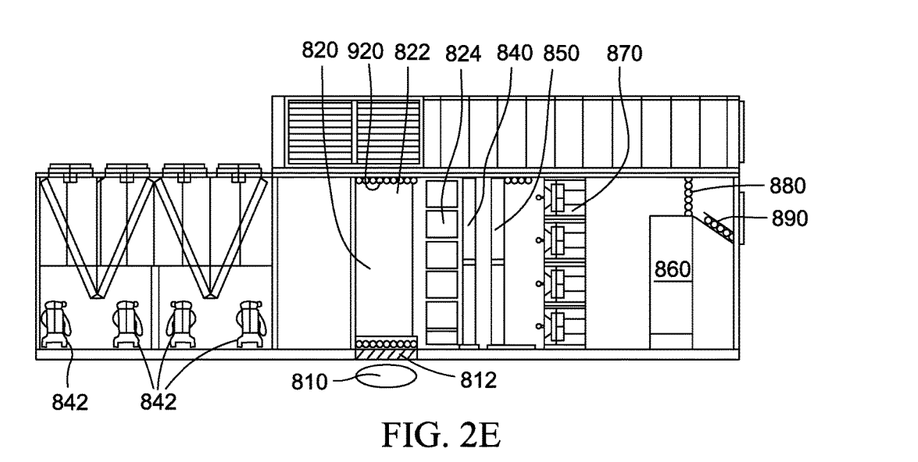

In a similar manner with respect to the exhaust fans 910, different from the previously described system, they are reconfigured so as to be upwardly facing, similar to the condenser unit fans 842B, whereas previously they were arranged in a horizontal arrangement as shown in FIG. 2C. Thus, as shown in FIG. 4, the exhaust fans 910 expel the air upwards, toward an exhaust canopy 1300, which will be further described.

The exhaust canopy 1300 includes a frame (not shown) sidewalls 1310, a top plate 1320, and an air opening 1330, with a plurality of moveable louvers 1340 positioned in a parallel arrangement in order to open and close, preferably in unison, using either a motorized unit or a manual lever, as described previously and hereinafter, in order to both (1) further reduce noise emissions into the external environment, and; (2) further reduce precipitation from entering into the air handling unit through the exhaust fans 910.

Still further, the sidewalls 1310 and top plate 1320, are again made of a welded steel frame and metal shrouding components bolted thereto, which together provide a canopy that maintains noise therein, which after internal reflections, a muffled version thereof is primarily emitted through the air opening 1330, as well as provide for keeping precipitation out. The presence of the moveable louvers 1340 positioned in a parallel arrangement allow for their closure either based upon the need for reduced noise or a precipitation event, as will be described further herein.

As mentioned, both the compressor louvers 1240 and the exhaust louvers 1340 positioned in a parallel arrangement in order to open and close, preferably in unison, with the opening and closing being performed using a motorized unit or a manual lever. These are preferably performed by a control system that implements the functions shown in FIG. 5, described hereinafter, such as the control system 1000 described with reference to FIG. 3.

With respect to noise minimization, depending on location of the facility, the louvers can be timed to close further or completely, so as to maintain a noise level within the acceptable noise standards of the community, which standards can change at different times of the day. In particular, more noise abatement, and louvers further closed, will typically occur during the evening hours, though this can change. This is shown in the FIG. 5 operational diagram 4000 as the time of day event 4010, which depending on the time of day, decision block 4020 will cause an opening signal 4030 or a closing signal 4040. It is understood that the opening signal 4020 and the closing signal 4040 can also include therein an amount of closing (10% . . . , 20% . . . 50%, . . . 100%) or a similar amount of opening.

With respect to precipitation events, the louvers can be caused to close further or completely, so as to keep precipitation out, as triggered by either an actual or a predicted storm, based upon either external remote weather inputs or precipitation sensors disposed on or near the air conditioning system 800/900 at some external location. This is shown in the FIG. 5 operational diagram 4000 as the precipitation event 4050, which depending on the amount of precipitation occurring, decision block 4060 will cause an opening signal 4070 or a closing signal 4080. It is understood that the opening signal 4070 and the closing signal 4080 can also include therein an amount of closing (10% . . . , 20% . . . 50% . . . 100%) or a similar amount of opening. The opening and closing signals for the time of day block can be used to create a predetermined noise profile, which covers different times of day, days of the week, weeks of the month, months of the year; and also can vary depending on other factors. In contrast, given the sporadic nature of weather, the opening and closing signals for the precipitation block are typically derived from real time or near-real time data, such as from the sensors described herein, which will create precipitation signals that can be used to control the opening and closing.

While in many instances the plurality of moveable louvers 1240 and the plurality of moveable louvers 1340 associated with the condenser and the exhaust, respectively are controlled to operate in the same manner, if desired, the plurality of moveable louvers 1240 can be controlled independently of the plurality of moveable louvers 1340.

It should also be noted that operationally, it is preferable not to constantly be changing the position of the louvers, and preferably having an interval during which the position is maintained constant, such as quarter hour or hour intervals, although intervals that are longer can also occur, such as 4 or 6 hours.

In another aspect, a reconciliation functional block 4085 is shown, such that if the time-of-day event block 4010 suggests an opening of the louvers, and the precipitation event block 4040 suggests a closing. A preferred rule to use is if either of the blocks suggests a closing than absent other circumstances, the closing should occur. In that vein, there is also an override function 4090, as shown, which may occur if other considerations warrant opening or closing the louvers, though a typical decision would be to open the louvers completely and allow for maximum efficiency.

It is also noted that the canopies can be oriented so that the air opening 1230 or air opening 1330 opens so that air and noise are directed away from the building (as shown in FIG. 4) or toward the building (not shown). In certain situations, given the size of the facility, orienting the air opening so air and noise are directed toward the building can be advantageous.

Although the present invention has been particularly described with reference to embodiments thereof, it should be readily apparent to those of ordinary skill in the art that various changes, modifications and substitutes are intended within the form and details thereof, without departing from the spirit and scope of the invention. Accordingly, it will be appreciated that in numerous instances some features of the invention will be employed without a corresponding use of other features. Further, those skilled in the art will understand that variations can be made in the number and arrangement of components illustrated in the above figures.

What is claimed is:

1. An air conditioning system for a building requiring a high volume of cooled air, the building having a ground level floor and including an exterior wall that provides a harrier against the external environment and includes a heated air opening disposed adjacent to a return air opening, the system comprising:
    a warm exhaust outlet duct formed through the heated air opening;
    a cool air inlet duct formed through the return air opening;
    an air conditioning apparatus connected to and that receives heated air from the warm exhaust outlet duct, connected to and emits cooled air into the cool air inlet duct, and connected to and emits vented air into the external environment through an exhaust opening, the air conditioning apparatus disposed in the external environment, external to the exterior wall, and mounted adjacent the exterior wall on a ground level support structure, the air conditioning apparatus further including:
    a heat exchange unit containing an exhaust fan disposed at a top surface of the heat exchange unit that emits heat from the heated air as the vented air upwardly, thereby allowing return air to pass through a return opening that contains a return damper disposed therein;
    an exhaust canopy that covers the exhaust fan and provides an opening through which the vented air will base pass to the external environment, the exhaust canopy further including a plurality of exhaust louvers, the plurality of exhaust louvers being controlled to (1) open or close to minimize noise from being passed into the external environment; and 2) open or close to reduce precipitation from falling onto the exhaust fan;
    a filter chamber, the filter chamber including an air intake area coupled to the heat exchange unit and an air filter, the filter chamber being configurable to receive the return air based upon a return air damper position, the filter chamber providing filtered air, and the heat exchange unit is disposed above the filter chamber and the condenser unit;
    a condenser unit coupled to the filter chamber that has an air cooling area over which the filtered air passes to create the cooled air, the condenser unit including:
    a direct cooling coil filled with a gas over which the filtered air passes, the gas being circulated through a condenser disposed within a walled area of the air conditioning apparatus;
    a plurality of condenser fans coupled to the direct cooling coil and disposed on a condenser unit top surface that emit heat from the direct cooling coil into the external environment in an upward direction, thereby allowing gas within the direct cooling coil to cool, the condenser unit top surface is adjacent to the top surface of the heat exchange unit;
    a condenser canopy that covers the plurality of condenser fans and provides an opening through which the heat from the direct cooling coil will pass to the external environment, the condenser canopy further including a plurality of condenser louvers, the plurality of condenser louvers being controlled to (1) open or close to minimize noise from being passed into the external environment; and 2) open or close to reduce precipitation from falling onto the plurality of condenser fans;
    a fan operable to push the filtered air through the air cooling area and toward the cool air inlet duct; and
    an outlet damper operable to control an amount of the cooled air delivered from the air cooling area to the cool air inlet duct.

2. The air conditioning system according to claim 1 wherein the heat exchange unit is contained within a first housing, the filter chamber and the condenser unit are contained within a second housing and the return opening is disposed between the first housing and the second housing.

3. The air conditioning system according to claim 1 further including a control system, the control system operable to automatically control each of the plurality of louvers in dependence on a predetermined noise profile and precipitation signals from a precipitation sensor.

4. The air conditioning system according to claim 3 wherein the plurality of condenser louvers and the plurality of exhaust louvers are controlled to operate in the same manner and thereby be maintained in a same relative position.

5. The air conditioning system according to claim 4 wherein the control system is further operable to automatically control each of the exhaust fan, the return damper, the outside air damper, the fan and the outlet damper.

6. The air conditioning system according to claim 1 wherein the exhaust canopy and the condenser canopy are each made of metal.

7. The air conditioning system according to claim 1, further including another air conditioning apparatus according to claim 1 adjacent to the air conditioning apparatus that is—further configured for connection to another warm exhaust outlet duct formed through another heated air opening in the exterior wall, and for connection to another cool air inlet duct formed through another return air opening in the exterior wall; and
    wherein the cool air duct and the another cool air duct connect together within the building.

8. The air conditioning system according to claim 2 wherein the first housing is attachable to and detachable from the second housing using bolts.

9. The air conditioning system according to claim 8 wherein the first housing is disposed above the second housing.

10. The air conditioning system according to claim 9, wherein the exhaust fan is disposed in a location directly above the return opening, the return opening being positioned in a floor of the first housing and a ceiling of the second housing.

11. An air conditioning system for a building requiring a high volume of cooled air, the building having a ground level floor and including an exterior wall that provides a barrier against the external environment and includes a heated air opening disposed adjacent to a return air opening, the system comprising:

a warm exhaust outlet duct formed through the heated air opening;

a cool air inlet duct formed through the return air opening;

an air conditioning apparatus connected to and that receives heated air from the warm exhaust outlet duct, connected to and emits cooled air into the cool air inlet duct, and connected to and emits vented air into the external environment through an exhaust opening, the air conditioning apparatus disposed in the external environment, external to the exterior wall, and mounted adjacent the exterior wall on a ground level support structure, the air conditioning apparatus further including:

a heat exchange unit containing an exhaust fan disposed at a top surface of the heat exchange unit that emits heat from the heated air as the vented air upwardly, thereby allowing return air to pass through a return opening that contains a return damper disposed therein;

an exhaust canopy that covers the exhaust fan and provides an opening through which the vented air will base pass to the external environment, the exhaust canopy further including a plurality of exhaust louvers, the plurality of exhaust louvers being controlled to (1) open or close to minimize noise from being passed into the external environment; and 2) open or close to reduce precipitation from falling onto the exhaust fan;

a filter chamber, the filter chamber including an air intake area coupled to the heat exchange unit and an air filter, the filter chamber being configurable to receive the return air based upon a return air damper position, the filter chamber providing filtered air;

a condenser unit coupled to the filter chamber that has an air cooling area over which the filtered air passes to create the cooled air, the condenser unit including:

a direct cooling coil filled with a gas over which the filtered air passes, the gas being circulated through a condenser disposed within a walled area of the air conditioning apparatus;

a plurality of condenser fans coupled to the direct cooling coil and disposed on a condenser unit top surface that emit heat from the direct cooling coil into the external environment in an upward direction, thereby allowing gas within the direct cooling coil to cool;

a condenser canopy that covers the plurality of condenser fans and provides an opening through which the heat from the direct cooling coil will pass to the external environment, the condenser canopy further including a plurality of condenser louvers, the plurality of condenser louvers being controlled to (1) open or close to minimize noise from being passed into the external environment; and 2) open or close to reduce precipitation from falling onto the plurality of condenser fans;

a fan operable to push the filtered air through the air cooling area and toward the cool air inlet duct;

an outlet damper operable to control an amount of the cooled air delivered from the air cooling area to the cool air inlet duct; and a control system, the control system operable to automatically control each of the plurality of louvers in dependence on a predetermined noise profile and precipitation signals from a precipitation sensor.

12. The air conditioning system according to claim 11, wherein the heat exchange unit is disposed above the filter chamber and the condenser unit, and wherein the condenser unit top surface is adjacent to the top surface of the heat exchange unit.

13. The air conditioning system according to claim 11 wherein the plurality of condenser louvers and the plurality of exhaust louvers are controlled to operate in the same manner and thereby be maintained in a same relative position.

14. The air conditioning system according to claim 13 wherein the control system is further operable to automatically control each of the exhaust fan, the return damper, the outside air damper, the fan and the outlet damper.

15. The air conditioning system according to claim 11 wherein the exhaust canopy and the condenser canopy are each made of metal.

16. The air conditioning system according to claim 11, further including another air conditioning apparatus according to claim 1 adjacent to the air conditioning apparatus that is further configured for connection to another warm exhaust outlet duct formed through another heated air opening in the exterior wall, and for connection to another cool air inlet duct formed through another return air opening in the exterior wall; and wherein the cool air duct and the another cool air duct connect together within the building.

17. The air conditioning system according to claim 11 wherein the heat exchange unit is contained within a first housing, the filter chamber and the condenser unit are contained within a second housing and the return opening is disposed between the first housing and the second housing.

18. The air conditioning system according to claim 17 wherein the first housing is attachable to and detachable from the second housing using bolts.

19. The air conditioning system according to claim 18 wherein the first housing is disposed above the second housing.

20. The air conditioning system according to claim 19, wherein the exhaust fan is disposed in a location directly above the return opening, the return opening being positioned in a floor of the first housing and a ceiling of the second housing.

* * * * *